United States Patent [19]

Shenk

[11] Patent Number: 5,483,202
[45] Date of Patent: Jan. 9, 1996

[54] COMPENSATED PHASE LOCKED LOOP FOR GENERATING A CONTROLLED OUTPUT CLOCK SIGNAL

[75] Inventor: Edwin K. Shenk, Westford, Mass.

[73] Assignee: Polaroid Corporation, Cambridge, Mass.

[21] Appl. No.: 299,481

[22] Filed: Aug. 31, 1994

[51] Int. Cl.⁶ ........................................ H03L 7/18
[52] U.S. Cl. ............................... 331/1 A; 331/25
[58] Field of Search ........................ 331/1 A, 25

[56] References Cited

U.S. PATENT DOCUMENTS

| | | | |
|---|---|---|---|
| 3,828,271 | 8/1974 | Schwanauer | 331/25 X |
| 3,870,970 | 3/1975 | Chibana | 331/25 |
| 4,180,783 | 12/1979 | Khalifa | 331/25 X |
| 4,504,800 | 3/1985 | Plouviez | 331/1 A |
| 4,531,102 | 7/1985 | Whitlock et al. | 331/1 A |
| 4,589,745 | 5/1986 | Plummer | 354/4 |
| 4,894,794 | 1/1990 | Shenk | 364/723 |
| 4,930,142 | 5/1990 | Whiting et al. | 375/120 |
| 5,254,958 | 10/1993 | Flach et al. | 331/10 |
| 5,304,955 | 4/1994 | Atriss et al. | 331/1 R |

OTHER PUBLICATIONS

Lindsey, William C., and Chie, Chak Ming, "A Survey of Digital Phase–Locked Loops," *Proceedings of the IEEE*, vol. 69, No. 4, Apr. 1981, pp. 410–431.

*Primary Examiner*—Siegfried H. Grimm
*Attorney, Agent, or Firm*—Christopher P. Ricci

[57] ABSTRACT

A method and apparatus for generating a controlled output clock signal which is frequency and phase referenced to an input signal is disclosed. The compensation is programmable to allow an external source, such as a processor, to download a compensation factor to create a variable frequency phase locked loop. A separate programmable divider is downloaded with a complimentary value to adjust the varied frequency signal to the frequency of the input signal.

16 Claims, 10 Drawing Sheets

COMPENSATED PHASE LOCKED LOOP FOR GENERATING A CONTROLLED OUTPUT CLOCK SIGNAL

BACKGROUND OF THE INVENTION

The present invention relates generally to phase locked loops and more particularly to compensated phase locked loops that generate controlled output dock signals.

Phase locked loops are employed to generate clock signals which are frequency and/or phase referenced to an external input signal. Phase locked loops are used in many fields of communication and are also employed in computer applications of data synchronization from an external source. The present invention is particularly directed to phase locked loops that are programmable to create selected pixel clocks within a computer printing system.

A phase locked loop typically consists of a phase comparator, a low pass filter, and a voltage controlled oscillator ("VCO") arranged in a feedback loop circuit as depicted in FIG. 1. The phase detector compares the phase of an input signal to the phase of the output the VCO and generates an error signal which is a measure of a phase difference of the two signals. Phase locked loops are often used to provide a stable clock output Other uses include tone decoding, demodulation, frequency multiplication, frequency synthesis and regeneration of signals. By way of example, see the following publication which provides a survey of digital phase locked loop technology: "A Survey of Digital Phase-locked Loops" by W. C. Lindsey and C. M. Chie, *Proceedings of IEEE*, Volume 9, Number 4, page 410, April 1981.

Broadly, a phase locked loop is considered to be a kind of filter that passes signals and rejects noise. Stated differently, the primary task of the phase locked loop is typically to reproduce an original signal while removing as much noise present in that signal as possible. To reproduce the signal, the phase locked loop makes use of a local oscillator, typically a VCO having a frequency that is substantially similar to that of the input signal, SIGIN. The VCO output and incoming signal wave forms are compared with one another by a phase detector whose output indicates instantaneous phase difference, i.e. phase error. In order to suppress noise, the error is averaged over some length of time and the average is used to establish the frequency of the oscillator.

If the input signal is well behaved and stable in frequency, the VCO will need little adjustment to be able to track the input signal. Any adjustment that is required is obtained by averaging over a long period of time thereby eliminating noise.

Many phase locked loops have been designed in the past, such as that shown in U.S. Pat. No. 4,930,142 by Whiting et at. entitled "Digital Phase Lock Loop" issued May 29, 1990, where a "divide by N" has been added between the VCO output and the phase detector in the feedback loop. The "divide by N" can be implemented as a counter or as a shift register with variable taps to set its length. The divider in the phase locked loop produces a pulse every N clock pulses and the phase comparater measures whether the divides pulses lead or lag the input pulses. This measure is quantized to a single bit in a digital system or a continuous waveform in an analog system indicating lead or lag and this quantized phase error is input to the filter.

With regard to the low pass filter, the complexity of the low pass filter varies depending on the amount of jitter and frequency variations expected. The output of an analog filter consists typically of a control signal in which voltage rises to increase the frequency of the VCO and declines to decrease the frequency of the VCO.

A problem with such phase locked loops is that N must be a preset constant quantity. If N were changed then the filter and the VCO would also have to change so that the frequency in the feedback loop is approximately that of the input signal, SIGIN and the filter is allowing a band-pass in the proper range. These changes usually involve changing hardware used in the circuit or manually adjusting the circuits themselves.

Some circuit designs require a variable frequency clock which is stable over a range of frequencies. The stability is gained through intricate circuit designs or by using a phase locked loop in which the discerning components, the filter and VCO, are adjusted dynamically to accommodate each new frequency. These solutions are expensive and impractical.

Therefore, it is an object of the invention to provide a phase locked loop which is dynamically programmable to create a stable clock output having a desired frequency.

It is another object of the invention to provide frequency programmability without requiring adjustments to individual components of the phase locked loop.

These and other objects of the invention are obvious and will appear hereinafter.

SUMMARY OF THE INVENTION

The aforementioned and other objects are achieved by the invention which provides a phase locked loop for generating a controlled output clock signal which is frequency and phase referenced to an input data signal. The phase locked loop comprises comparator means, oscillation means, compensation means, and divider means.

The input signal is generally a periodic pulse signal, from a tachometer in an optical printer for example. The input signal can pass directly into the phase locked loop or, optionally, can be transmitted through a flip-flop to regulate a duty cycle of the signal to fifty percent to reduce error propagation.

In either event, the input signal is then passed to the comparator means which compares the input signal to a feedback signal and generates an error signal representative to a phase difference between the two signals.

Again optionally, the error signal can, and often is, then passed through a filter which limits noise propagation in the error signal. The filter means is usually a low-pass filter to remove high frequency noise.

The error signal is then transmitted to the oscillation means which generates a frequency which is varied in response to said error signal to produce a digital pulse train. Dependent upon the error signal, the oscillation means will adjust a phase and frequency of oscillation of the digital pulse train.

The compensation means then performs a mathematical operation on said digital pulse train, such as a division, so as to alter a frequency of said digital pulse train by a predetermined programmable amount to produce the controlled output clock signal which is compared with the input signal.

Finally, the divider means mathematically alters the variable clock signal, again by a programmable amount which is complementary to the predetermined programmable amount, to produce the feedback signal which has a frequency substantially similar to said digital data signal. This reconstruction of the incoming frequency allows the phase locked loop to be varied about a wide range of frequencies without requiring adjustment of the oscillator and filter while still gaining the advantages of phase locking.

In further aspects, the invention provides methods in accord with the apparatus described above. The aforementioned and other aspects of the invention are evident in the drawings and in the description that follows.

BRIEF DESCRIPTION OF THE DRAWINGS

The foregoing and other objects of the invention, the various features thereof, as well as the invention itself may be more fully understood from the following description when read together with the accompanying drawings in which.

DESCRIPTION OF THE PREFERRED EMBODIMENT

The invention is illustrated in the various Figures as used within a drum printer for optically printing an image upon a recording medium such as photographic film. While this is the illustrated embodiment, the invention may be used within various other printing devices and non-printing devices, and therefore the illustration should be considered purely illustrative and not restrictive.

Figure 1:
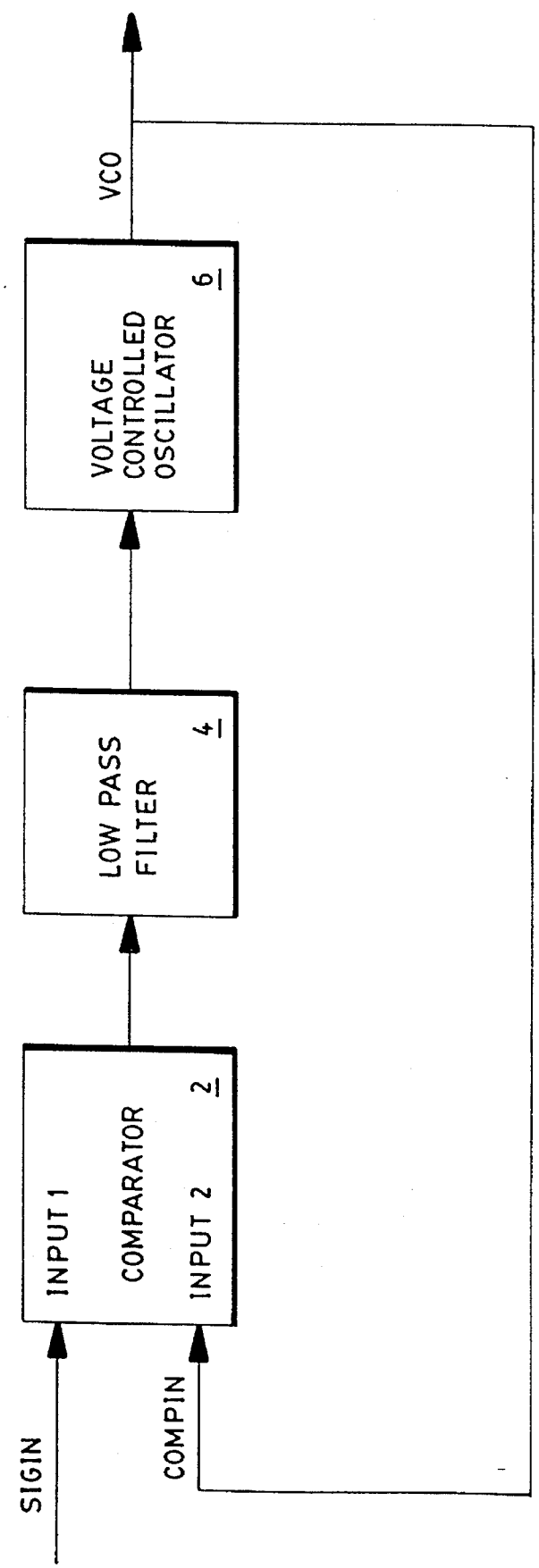
FIG. 1 shows a block diagram of a typical prior art phase locked loop.
Figure 2:
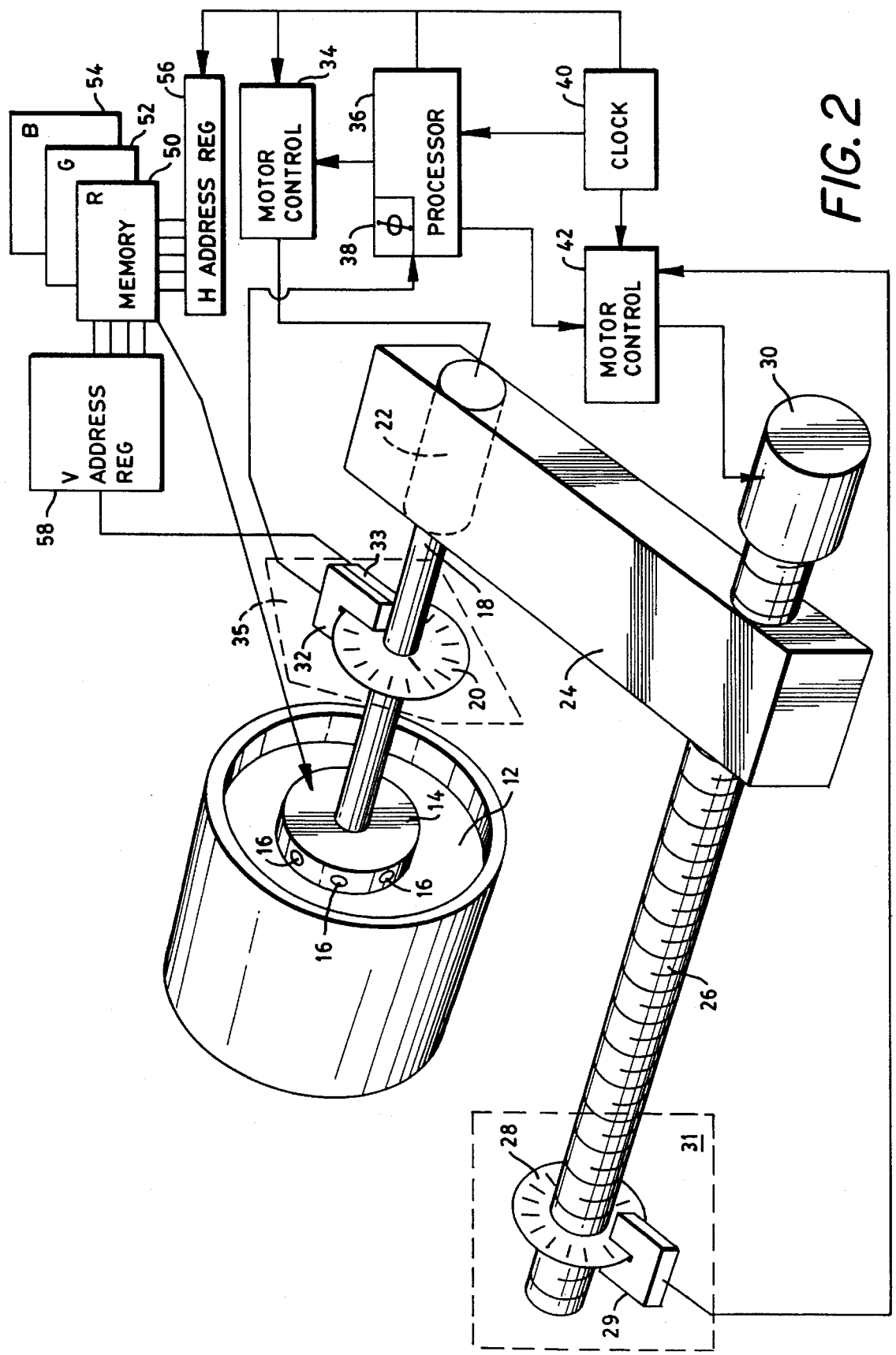
FIG. 2 shows a functional block diagram of a drum printer employing the compensated phase locked loop of the invention.

FIG. 2 shows a drum printer having a spinner 14 which spins within a drum 10 and having a recording medium 12 held within the drum 10 for printing an image onto the recording medium 12. The recording medium 12 may be photographic film or other optical media.

The image is transferred to the recording medium 12 by a spinner assembly 14 which continuously rotates three or more light emitting diodes ("LEDs") 16 held within the spinner assembly 14. The LEDs 16 transmit red, green, and blue light through lenses (not shown) onto the recording medium 12 so that full color imaging is accomplished. In the case of monochrome imaging, a single LED may be used without detriment to the invention. The spinner 14 is rotated about its center axis by a drive shaft 18 which in turn is connected to a motor 22 for generating the rotational motion. Also attached to the drive shaft is an encoder disk with radial slots bored therethrough which allow light to pass through the encoder disk 20 as the drive shaft 18 rotates.

The spinner 14 begins each new line on one side of the recording medium 12 and through a rotational motion places a line of the image sequentially onto each new line of the recording medium as it rotates at approximately 1000–6000 revolutions per minute. The direction of new line going across the recording medium 12 is designated tile fast-scan direction.

The entire spinner assembly as described is driven along a slow-scan direction as the printer systematically increments the lines across the recording medium 12 by attaching the print structure, including the spinner assembly 14, the motor drive shaft 18, and encoder disk 20, with a carriage arm 24. The carriage arm 24 is then attached at an opposite end to a lead screw 26 which is rotated by a second motor 30. Rotational motion of the lead screw 26 is translated into linear motion of the carriage assembly 24 by a nut (not shown) within the carriage assembly. The movement of the lead screw in the slow-scan direction is monitored by an encoder disk 28 similar to that previously described. The encoder disk 28 has slots cut therethrough in a radial direction so as to allow light to pass. A optical interrupter 29 transmits light through the encoder disk 28 and transmits a pulse each time light is allowed to pass through a slot thereby monitoring the rotational speed of the lead screw 26. The combination of the encoder disk 28 and the optical interrupter 29 is termed a slow-scan tachometer 31.

In the same way, the fast-scan optical interrupter 32 is mounted such that the encoder disk 20 passes therethrough. The optical interrupter 32 records each slot of the encoder disc 20 that has rotated through the optical interrupter 32 thereby monitoring the rotation in the fast-scan direction. The combination of the encoder disk 20 and the optical interrupter 32 is termed a fast-scan tachometer 35. The pulses generated by the optical interrupter 32 monitoring the fast-scan direction are then transmitted to a processor 36.

The processor 36 can be any of various electronic processors including microprocessors or may simply be dedicated logic such as an application specific integrated circuit ("ASIC") as used in the preferred embodiment. The processor uses the information garnered from the slow-scan tachometer and the fast-scan tachometer in the phase locked loop 38 to generate a proper signal to a motor control 42 which in turn governs the speed of the motor 30 driving the lead screw 26 in the slow-scan direction while also governing a duration of firing of the LEDs 16 as is later herein described. A clock 40 such as a crystal oscillator is used to keep synchronous timing within all of the electronic devices.

An index optical interrupter 33 also monitors the encoder disk 20 in the fast-scan direction. This optical interrupter 33 has optical sensors offset from the fast-scan optical interrupter 32 such that only a single slot set in toward a center of the encoder disk 20 is monitored. This single slot causes the index optical interrupter 33 to generate an index pulse once per revolution of the encoder disk 20, or once before initiation completion of a print line on the recording medium 12.

The index pulse is fed into a vertical address register 58 which increments address information in the slow-scan direction, or vertically. A horizontal address register 56 performs a similar function and is incremented by the phase locked loop 38 within the processor 36. In this way the processor 36 governs all aspects of how and when the image is transmitted to the recording medium 12.

The vertical 58 and horizontal 56 address registers transmit binary address information to memory locations in random access memory ("RAM") 50, 52, 54. There are three separate addresses actually transmitted to three RAM modules 50, 52, 54. The first RAM module 50 holds red image data for the image; the second RAM module 52 holds green image data and the third RAM module 54 holds blue image data. These three sets of address are used to compensate for the different radial locations of the LED's 16.

All of the aforementioned image data is then transmitted to the LEDs 16 and projected onto the recording medium 12.

A second motor control 34 is used to govern the fast-scan direction and feeds into the motor 30 driving the lead screw 26 in the fast-scan direction. Under most circumstances, this motor control 34 simply maintains a constant motor speed.

Figure 3:
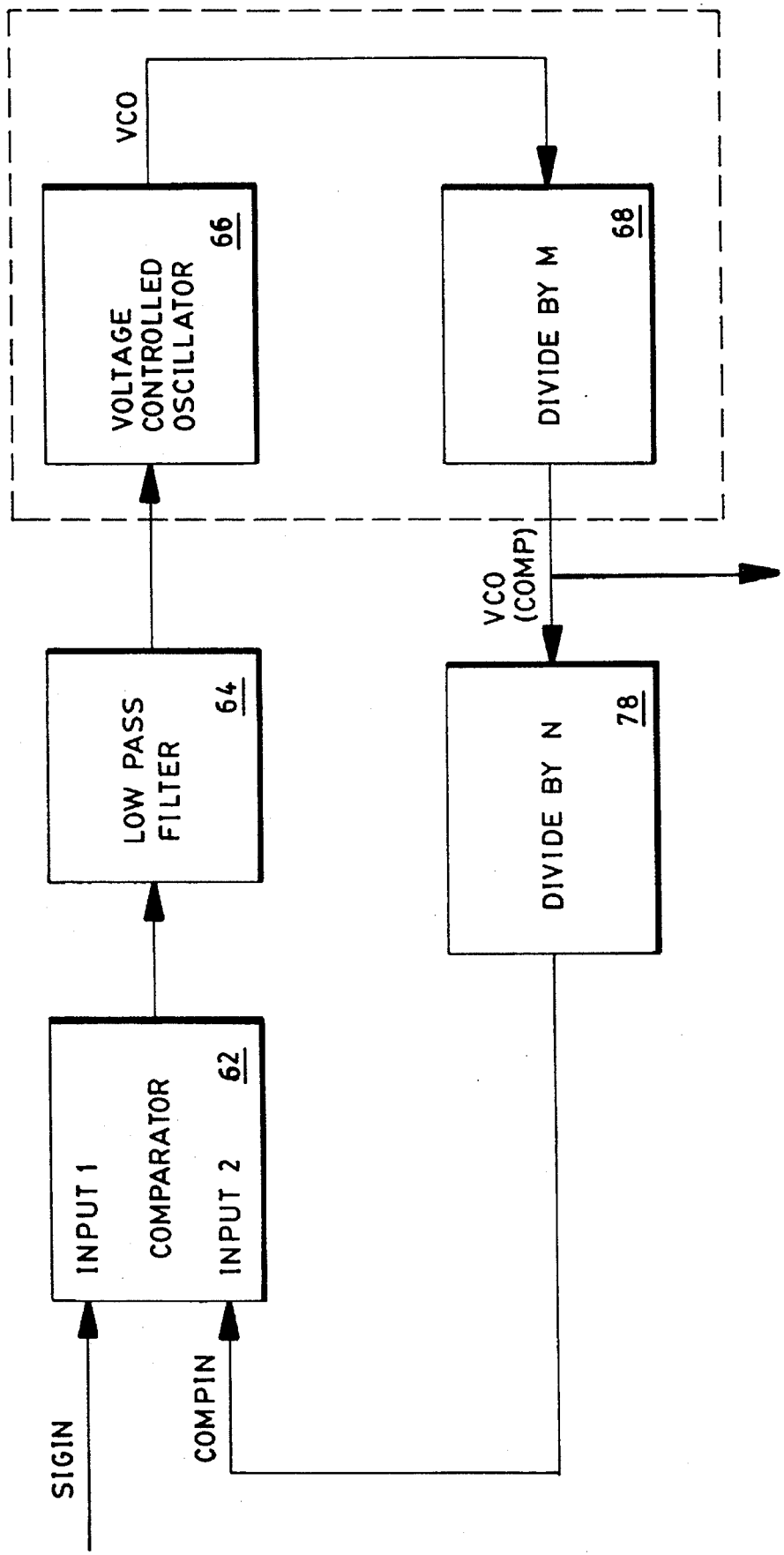
FIG. 3 shows a block diagram of the compensated digital phase locked loop in accordance with the present invention.

Looking closer at the compensated phase locked loop 38, FIG. 3 shows the loop 38 in block diagram form. A reference signal, SIGIN, is fed into input 1 of a phase comparator 62. SIGIN is then compared to a comparison signal, COMPIN, from a feedback loop which enters the comparator 62 as input 2.

The results of the comparison is a difference signal reflective of a phase difference between SIGIN and COMPIN. In the preferred embodiment, the phase comparator 62 is a digital device providing a time modulated difference signal. An alternative embodiment employs an analog difference signal to describe the phase of COMPIN as leading or lagging SIGIN.

The difference signal is then passed through a low pass filter 64. The low pass filter may also be a narrow band-pass filter depending upon an allowable range of the difference signal. The goal of the filter is to smooth only the difference signal and pass it without additional noise. A resulting signal is then passed into a voltage controlled oscillator, "VCO". The VCO is an oscillator generating a variable frequency clock output which is varied as a function of input voltage. The clock output is then passed to a divide by M 68 which divides the frequency by the value of M. The "divide by" function is typically performed by a binary down counter which decrements for each clock pulse from the clock error. In this particular divider, the value of M is programmable from an external source and is used to adjust the frequency to a wide range of possible values.

Both the VCO 66 and the divide by M 68 are shown within a dashed line. The VCO 66 is said to be compensated by the divide by M 68 due to the programmability of the divide by M. Since M is programmable to adjust frequencies dynamically, the analog devices such as the filter 64 and the VCO 66 do not need adjustment to accommodate a wide frequency range.

The compensated VCO output is then fed into a divide by N 78. The divide by N is also a programmable divider and is responsible for performing a second frequency division to ensure that the frequency of COMPIN is substantially the same as the frequency of SIGIN. And since the frequency of the compensated VCO output varies according to the value of N, M must be adjusted to compensate for the changes in N. Therefore, M is responsible for determining the number of compensated VCO cycles per cycle of SIGIN.

Figure 4:
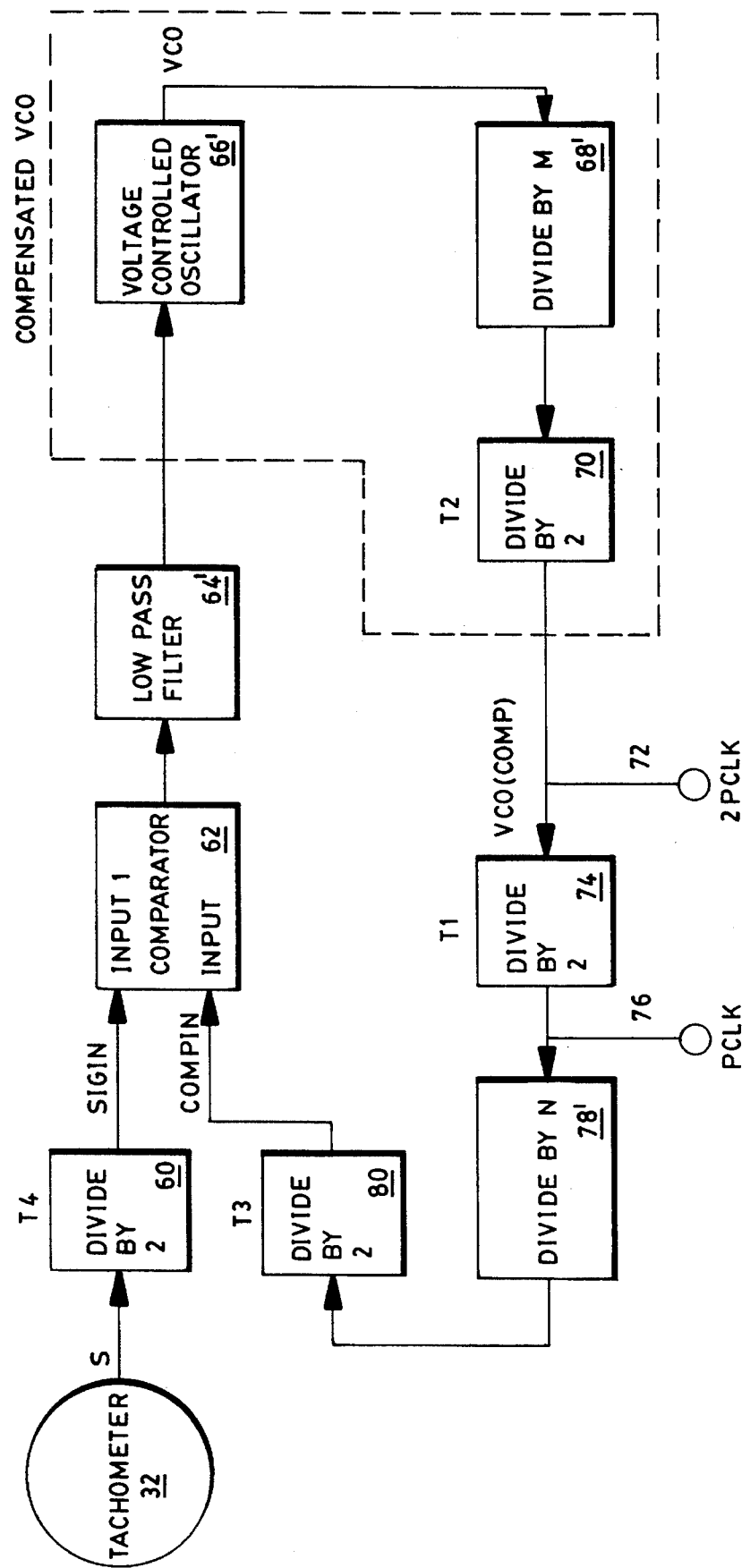
FIG. 4 shows an expanded block diagram of the compensated digital phase locked loop of the invention as shown in FIG. 3.

When the system is "locked", the control voltage is such that the frequency of the VCO is exactly equal to the average frequency of the input signal divided by the product of M times N. For each cycle of input, there is M×N cycles of oscillator output. The product of N times M defines the open loop gain of the feedback loop. Therefore, the circuit will "lock" on M×N times the frequency of SIGIN. Referring now to FIG. 4, a block diagram of an expanded compensated phase locked loop is shown which is an expansion of the phase locked loop of FIG. 3 and is useful with the drum printer of the type shown in FIG. 2. Therefore, the Figure will be described with reference to FIG. 2 and FIG. 3 where like numerals represent like parts. The tachometer 32 that monitors the fast-scan direction is shown, feeding in a signal indicating the current speed of the drive shaft 18. The signal from the tachometer 32 is fed into a divide by 2 60 which serves to reduce symmetry errors due to the mechanical fabrication of the optical interrupter 20 of the tachometer 35 by making the duty cycle of the incoming signal closer to 50%. "Divide by 2'"s in the preferred embodiment are J–K flip-flops clocked by the incoming signal. The resulting signal is then fed into a phase comparator. As previously described, the phase comparator measures whether the feedback pulses lead or lag the input pulses. This measure is quantized and this quantified phase error is input to the low-pass filter 64.

The low-pass filter 64 reduces jitter and frequency variations and produces an output which is a smoothly changing control signal, that modifies the VCO frequency in response to the detected phase error.

The control signal is then fed into a voltage controlled oscillator "VCO" 66' which generates a clock signal having a frequency that is controllable by the input voltage. Therefore, as the output of the filter 64' decreases, the frequency generated by the VCO 66' also decreases and vice versa. The clock signal which is generated by the VCO 66' is then fed into a divide by M 68' which is as previously described. The output of the divide by M 68' is fed into a divide by 2 70 which serves to improve the convergence of colors in the fast-scan direction by making the maximum error per pixel down to a quarter pixel length. This may further be increased by adding additional divide by 2's in this place, the limitation being that the VCO 66' has to be able to generate a clock signal at a sufficient frequency to compensate an additional division. In the preferred embodiment two of these divide by 2's are used to reduce the error down to ⅛ pixel.

The output of the divide by 2 70 is a two pixel clock. The two pixel clock is useful for interpolation as further described in U.S. Pat. No. 4,894,794 by Edwin K. Shenk, "System for Providing Continuous Linear Interpolation" issued Jan. 16, 1990, included herein by reference. A further cascaded divide by 2 74 takes the two pixel clock 72 as input and divides it by two to produce a pixel clock output 76. The pixel clock 76 is used as the signal feeding the horizontal address register 56 which in turn prompts the memory to send the proper data to the spinner 14 as previously described.

The pixel clock 76 is then run through a divide by N 78' which produces a signal representing N pixels per slot. The N of the divide by N 78 is determined by the processor 36 and downloaded into the phase locked loop 38 by the processor 36. The number N is chosen by the processor 36 to be the proper number of pixels across one line in the fast-scan direction. The M of the divide by M 68' is likewise chosen, but is chosen as a conjugate of the divide by N 78 to keep a substantially constant product between the divide by N 78' and the divide by M 68'. In other words, the phase locked loop in an attempt to keep a constant error with changing "divide by" values uses N to compensate for the changes in N where N is changed to adjust the number of pixels across the recording medium 12 in the fast-scan direction. The output of the divide by N 78' is then fed into a divide by 2 80 which again creates symmetry making a 50% duty cycle.

An application of the previously described phase locked loop 38 within the drum printer system of the preferred embodiment is in a zooming system. The zooming system in a printer allows a user to increase magnification or decrease magnification of an image that is to be printed by changing a size of individual pixels. For a printer with a non-adjustable spot size, i.e. the spot stays constant when an image is zoomed, quality of a zoomed image can be enhanced by using the invention.

Figure 5:
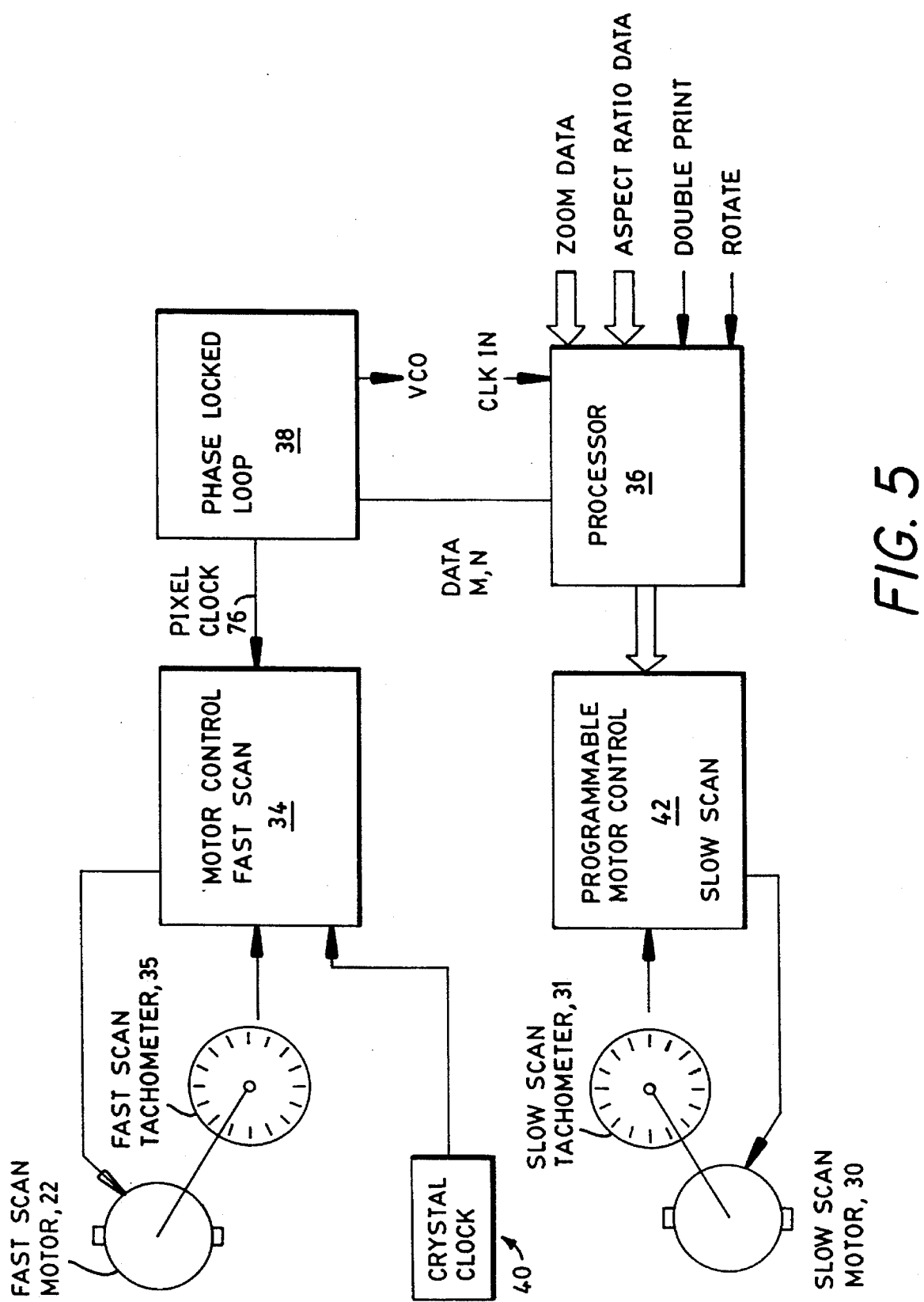
FIG. 5 shows the compensated digital phase locked loop of the invention interconnected with motor controls for controlling printer zooming.

FIG. 5 shows the phase locked loop 38 of the previous embodiment being used with programmable motor controls 34, 42 such that zooming is enabled.

Zooming in this context is the enlargement or reduction of an original image onto a printed image. The invention is also useful for dynamically altering an aspect ratio of an image thus lending itself readily to orientation changes or changes of recording media, but will be described with zoom only. It should be noted though that a length and width of image forming pixels are dependent upon printing orientation, aspect ratio, as well as zoom though these variables will not be discussed henceforth. As described for FIG. 2, the fast-scan motor 22 is monitored by the fast-scan tachometer 20. This produces an input to the motor control 34 which speeds up and slows down the fast-scan motor 22. The motor control is clocked on the crystal clock 40.

The invention actually achieves adequate performance with a motor 22 having a fixed rotational speed in the fast-scan direction. This is true since the phase locked loop is creating a pixel clock that is determining when the LED's 16 illuminate. Varying the motor speed adds improved performance by narrowing a working range of the VCO within the phase locked loop. The M and N dividers are restricted to integers and, therefore, their product when divided into the VCO signal frequency can not always exactly divide the frequency of the VCO to produce a signal which is equal to the frequency of the input signal from the fast-scan tachometer 35. In fact, variation of an order of plus or minus five percent of the nominal frequency are typical. The VCO must be designed to span this frequency and adjust accordingly.

To reduce this error, the motor control 34 adjusts the rotational speed of the motor 22, thus compensating for the error. In mathematical terms, $$SIGIN = \frac{VCO}{M \times N}$$

where the frequency of SIGIN is fixed and M and N must be integers. Therefore, as M and N varies to keep the VCO constant, the equation becomes unequal by an amount of error.

To remove the error, the reference signal, SIGIN, is adjusted to compensate for the additional error. Rewriting the previous equation illustrates how changing the reference signal removes the error.

$$VCO = (M \times N) \times SIGIN$$

Control of the fast-scan and the slow-scan must be synchronized in order obtain a proper print. The slow-scan moves one pixel while the fast-scan moves one line of pixels, essentially forming two perpendicular axes. FIG. 5 illustrates electronically linking the two scan axes where separate prime movers, or motors, 22, 30 are used. This allows for a multiplicity of linking ratios to accommodate various magnifications and pixel aspect ratios.

The motor control 34 receives its pixel clock signal 76 which indicates the frequency at which a pixel is printed from a phase locked loop 38 as previously described. The processor 36 receives zoom data, aspect ratio data, multiple print data and rotation data from external sources. The zoom data indicates the degree of magnification requested for the print. The aspect ratio data reflects the pixel width versus the pixel length which is often dependent on the dimensions of the recording medium. The multiple print is an amount of overlap between pixel line prints where line data is repeated more than once. Overlapping the pixel prints enhances continuity while maintaining image definition. Multiple print is either a user requested function where a user chooses to sacrifice print time for increased print quality, or is processor required when a zoom enlarges the pixel size such that a single pass does not complete the pixel print. Rotation is simply landscape versus portrait of the image onto the recording medium.

The processor 36 takes in the aforementioned data along with the clock input, CLK IN, to determine various characteristics and ratios necessary to perform the printing operation. The clock input may be the VCO output or it may be a separate crystal clock depending on the circuit configuration. The processor 36 upon receiving the aforementioned data calculates the M and N divisions required by the phase locked loop 38, as previously described, in order to achieve the desired zoom. At the same time, the processor signals to the programmable motor control 42 in the slow-scan direction to increase or decrease the speed of the slow-scan motor 30. The change in speed is reflected in the tachometer 31 and is signaled back to the programmable motor control 42 for closed loop operation.

For zooming, the variable N in the compensated phase locked loop ranges in the preferred embodiment from 4 to 36 giving a zoom of 9:1. This is a relative zoom, the absolute size is established by the number of tachometer slots and the diameter of the drum in the case of a drum printer. By way of example, L=drum diameter S=number of tachometer slots film length per tachometer cycle=(Π*D)/S Pixel size=(Π*D)/(S*N)

For a drum printer, the above equation is used by the processor 36 to determine pixel size for a given zoom.

The basic principle is that a pixel is printed starting with one pixel clock count and ends with the next pixel clock count. If the frequency of the pixel clock changes, the pixel changes size in proportion to the pixel clock period. If the pixel clock is made very slow the pixels get very large and distinct, much like tiles. This is where intermediate fill techniques may be applied to provide continuity. The pixel clock is doubled and half size pixels are printed at the original locations. In between these locations, half size interpolated pixels are printed. This does not really add new data to the image but rather performs a smoothing operation.

Figure 6:
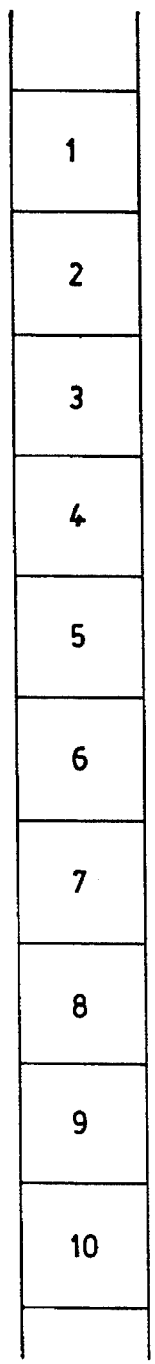
FIG. 6 shows pixels size changes in a fast-scan direction.
Figure 6:
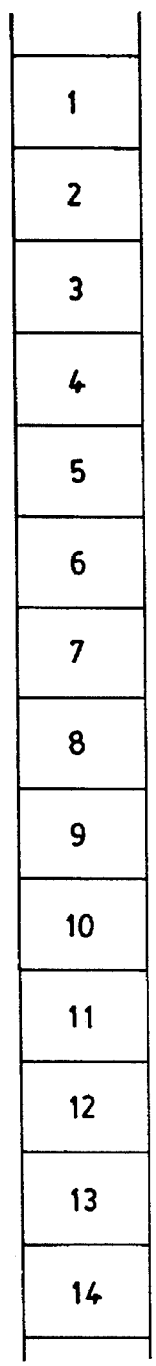
Figure 6:
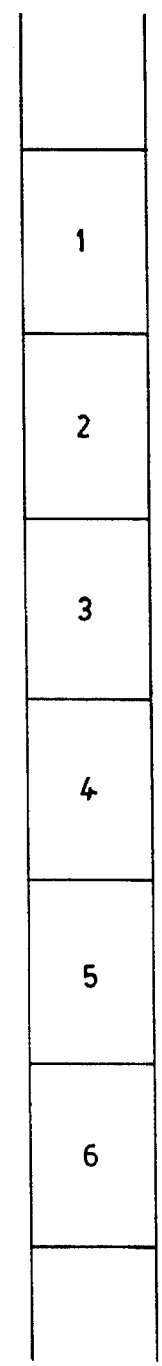

FIG. 6 shows zooming of pixels in a fast-scan direction. On the left is shown a column marked "normal" which indicates a normal pixel size for a 1:1 image zoom. The second column marked "reduced" shows an increase pixel clock in a fast-scan direction thereby indicating numerically that four more pixels can be imaged in the fast-scan direction in a similar area as the "normal." The "magnified" view shown in the two columns to the right illustrate first in the fast-scan direction how the pixel is elongate by decreasing the pixel clock and the final column how each pixel is interpolated using the process previously described of overlapping pixels to create a blending of similar pixels, thereby reducing artifacts and retaining a sharp image.

Figure 7:
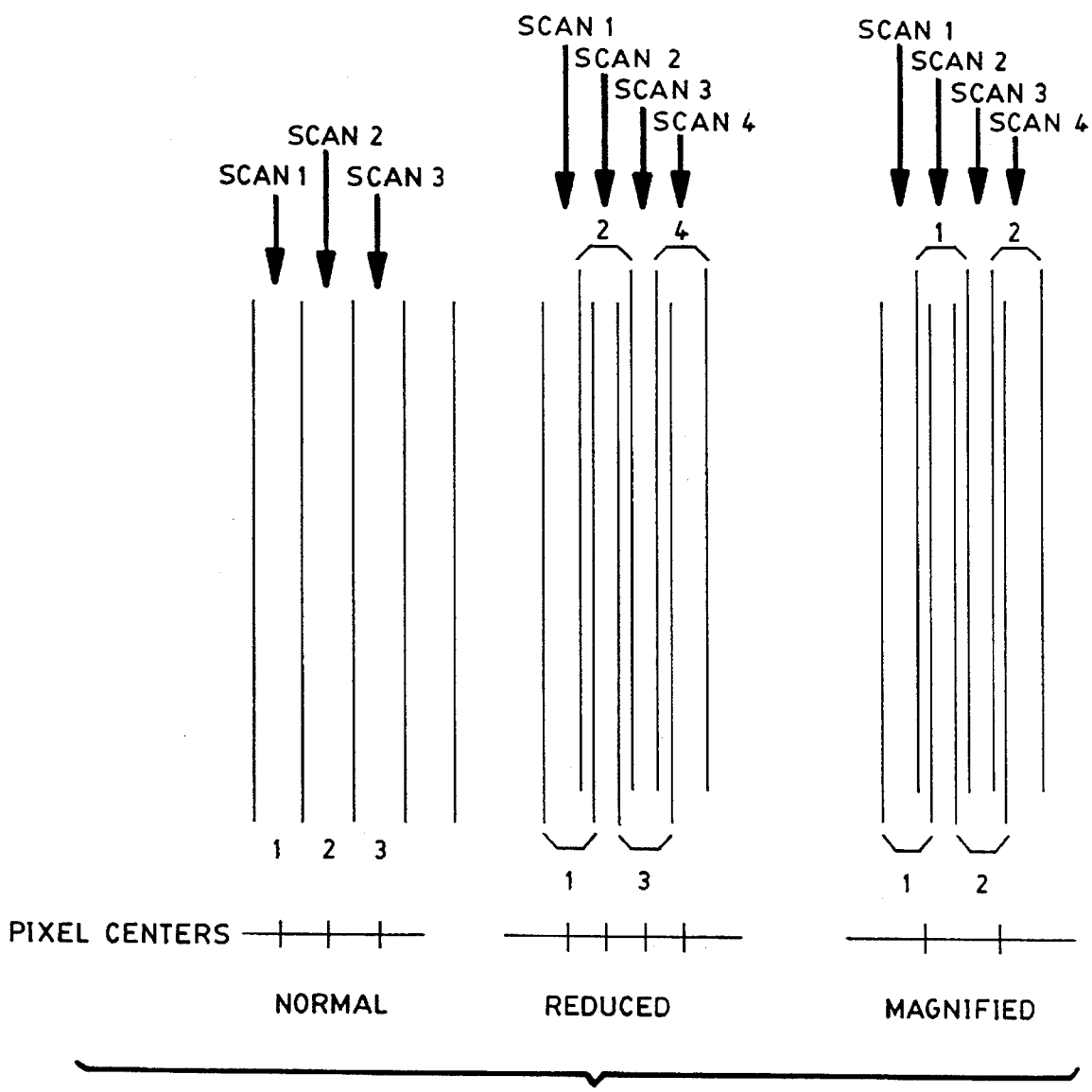
FIG. 7 shows line overlaps in a slow-scan direction.

FIG. 7 indicates a normal, reduced and magnified view along the slow-scan direction where in the normal view the scan is run along the rows at a "normal" rate as indicated by scan 1, 2, and 3.

In a "reduced" view, there is a significant overlap between the rows as the slow-scan passes along the image surface. The overlap can be seen in that now four scans are being performed in a similar area as the three scans shown in the "normal" imaging process.

In the "magnified" view the spots are run over the surface of the image multiple times with repeated data in order to overlap and create the magnified view. The amount of overlap depends on the amount of magnification desired.

The slow-scan zoom is more difficult because the spot size is constant. When the pixel dimensions in the slow-scan direction becomes larger than the spot size, incomplete coverage results. The solution is to use more than one slow-scan pass to print a pixel. An example would be to make a pixel that is twice as large by printing the same data twice on two successive scans while keeping the scan pitch constant. The technique works well for any size pixel by changing the pitch so that successive scans overlap to create a new larger pixel of a desired size. This overlap also occurs between scans where the data is different. The overlap generates an interpolated pixel which serves to reduce "tile" artifacts on the slow-scan axis. Enlargements of 2:1 are achieved with these double scan techniques. This multiple pass printing technique may be extended to more than two passes as the enlargement is increased. A further enhancement is to apply data modification by intermediate fill techniques as in the high speed scan.

Image size reduction is basically the same as magnification with the exception that the multiple pass printing is not necessary (although it may be used). The printing pitch is decreased to provide overlap and again producing a stripe of interpolated pixels. Higher magnifications are attained by expanding the double scan techniques to include triple, quadruple, et cetera, pass printing The choice of the appropriate multiple printing number also depends on the resolution of the media. At some zooms the exposure is not absolutely uniform. The nonuniformity is of the form of alternating lines of greater or lesser exposure. The greater and lesser exposure lines are not always the same width as this is also a function of the zoom ratio. Normally the spacial frequencies of these lines are high enough so as not to be visible on the film. Increasing the scan multiplier also increases this spacial frequency rendering the lines invisible on high resolution media.

FIGS. 8A–8E exemplify the zooming abilities of the drum printer as described.

FIG. A shows a single print at a 1:1 zoom, the ordinate of the graph is designated as pixel clock which is the pixel clock 76 of the phase locked loop 38. The abscissa designates the slow-scan direction and designates individual spots shown as a hexagon as per commonly assigned U.S. Pat. No. 4,589,745 entitled "Geometric LED Layout for Line Exposure" issued to William T. Plummer on May 20, 1986.

In the 1:1 zoom the individual spots shown on the abscissa overlap only on the triangular end portions allowing sufficient blending between pixels while retaining in a rectangular section for each individual spot. The pixel clock is at its normal position. It can be seen from this illustration when considered with the previous Figure that the pixel clock varies the fast scan direction overlap while the slow scan motor velocity varies overlap in the slow scan direction.

Figure 8B:
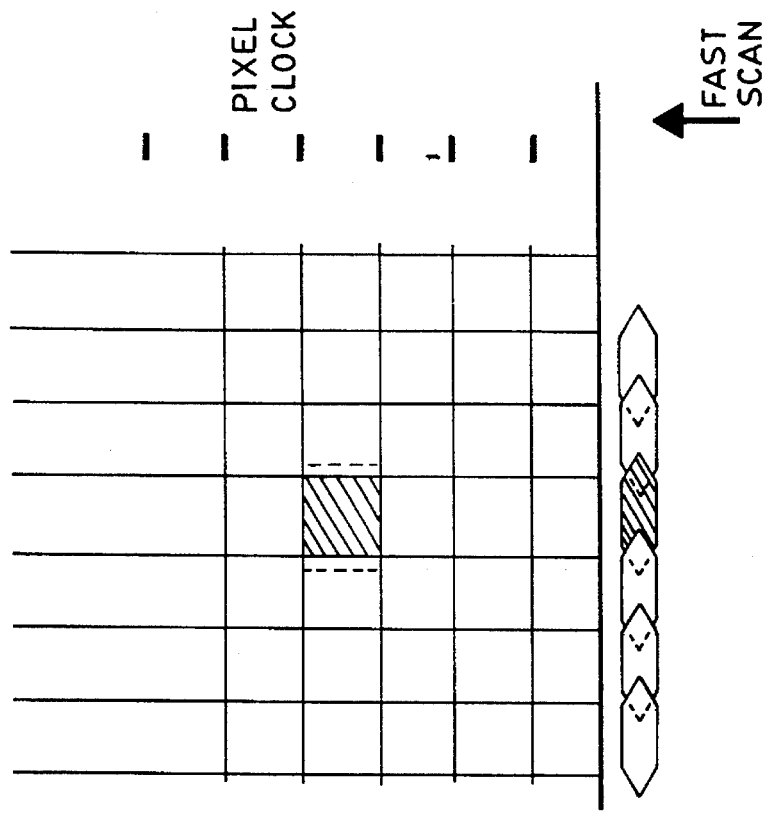
FIGS. 8A–8E are a series of pixel graphs illustrating zooming capabilities made possible by the compensated phase locked loop of the invention as illustrated in FIG. 3.

FIG. 8B illustrates a single print of a 0.75:1 zoom. This is a reduction to 75% of an original image size. This is accomplished using the phase locked loop as previously described to adjust the pixel clock, shown on the ordinate, to decrease the pixel size in the ordinate direction and also to adjust in the slow-scan direction the speed at which the scan is performed across the image surface. The overlap is depicted as dotted lines indicating overlap between the rectangular sections of the hexagonal spot. This overlap is not easily visible to the naked eye and is generally seen as further bending of the image.

Figure 8A:
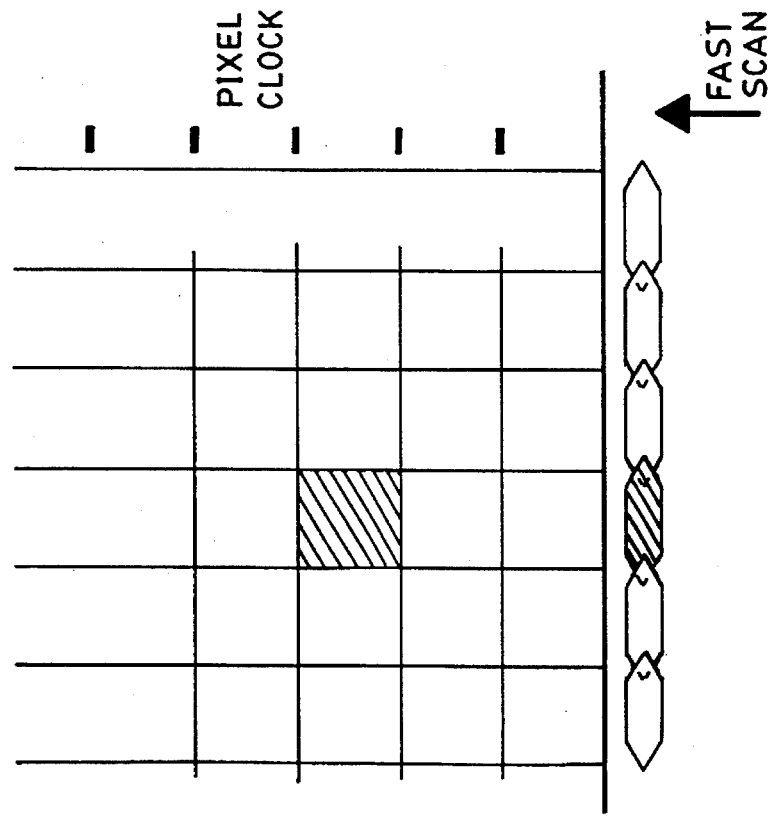
Figure 8D:
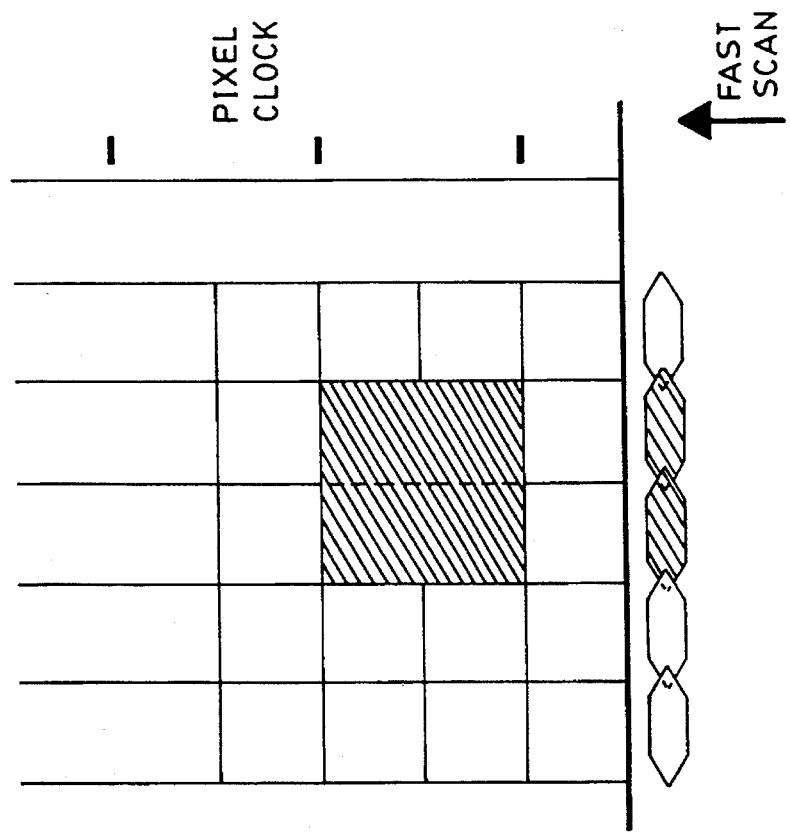
Figure 8C:
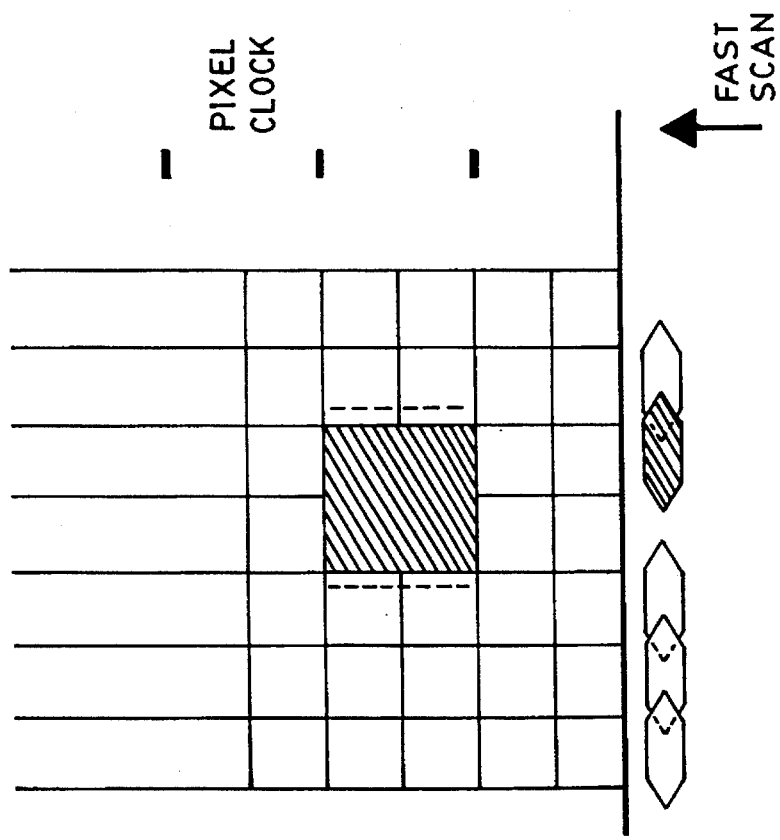

FIG. 8C is a double print of a zoom of 1.5:1. At 1.5:1 the image will be enlarged by 150%. Double printing, as previously stated makes the individual spots overlap even further in the slow-scan direction, decreasing noticeable lines and artifacts in the image. In the 1.5:1 zoom, the pixel clock is increased from normal as seen in FIG. 8A to 150% of the previous pixel clock. This is accomplished by adjusting M and N in the phase locked loop 38 to increase the pixel clock rate. A similar overlap as seen in FIG. 8B can be seen in FIG. 8C as before such an overlap is not visible to the naked eye.

FIG. 6D shows a double print at 2:1. This 200% increase again shows the elongated pixel clock width on the ordinate and in the abscissa there can be seen no overlap as it is an integer multiple of the original pixel size in the original slow-scan direction. Therefore no dotted lines are shown.

Figure 8E:
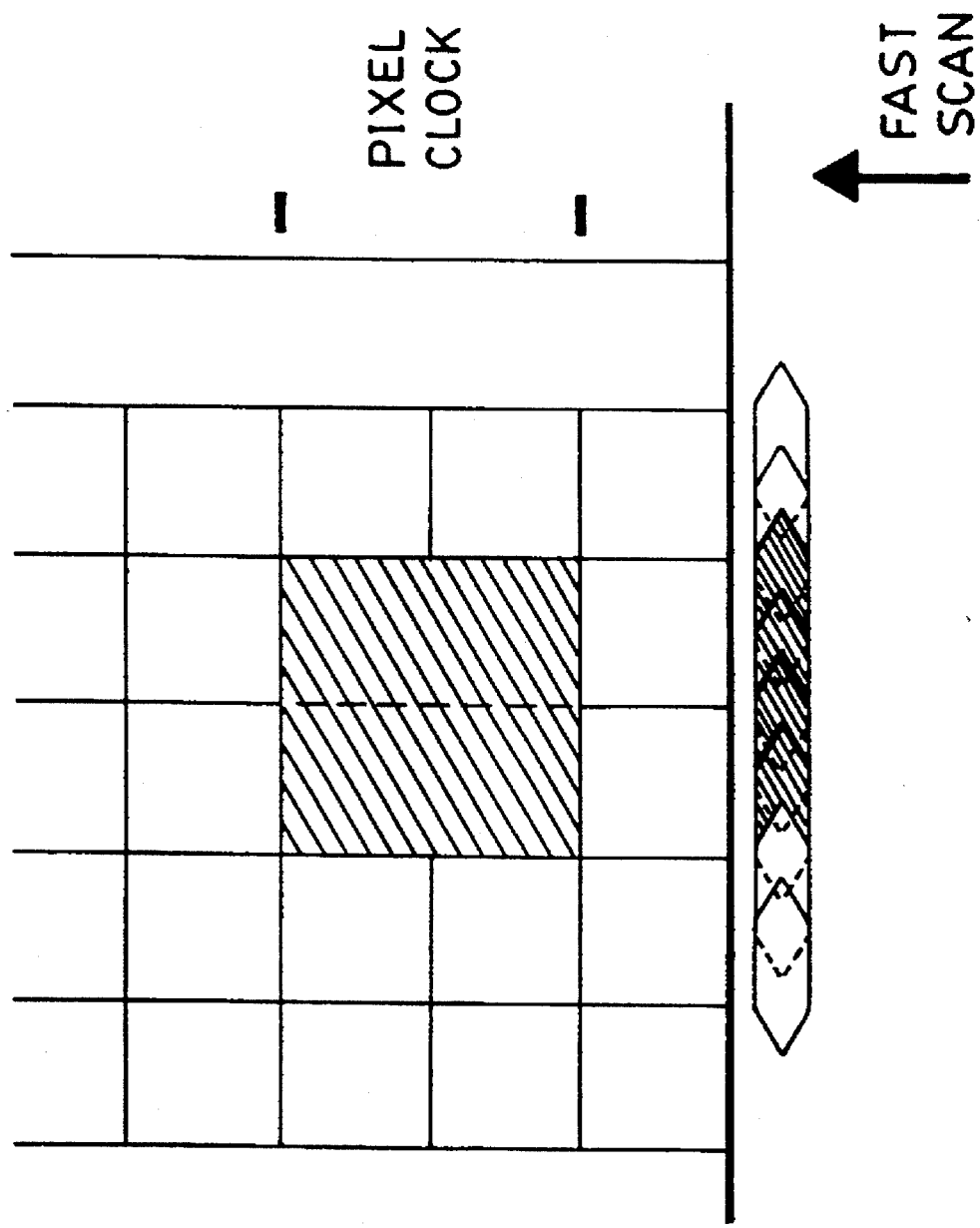

FIG. 8E shows a quad print at a 2:1 zoom. Quad print performs the same function as seen in increasing from single print to double print. Here quad print is shown as four darkened spots in the abscissa which again increases the overlap and thereby increases color density while reducing artifacts.

The invention may be embodied in other specific forms, without departing from the spirit or essential characteristics thereof. The present embodiments are, therefore to be considered in all respects as illustrative and not restrictive, the scope of the invention being indicated by the appended claims rather than by the foregoing description and all changes which come within the meaning and range of equivalency of the claims are therefore intended to be embraced therein.

I claim:

1. A phase locked loop for generating an output clock signal which is frequency and phase referenced to an input signal having a first frequency, said phase locked loop comprising comparator means adapted to receive the input signal and a feedback signal for comparing said input signal to said feedback signal and for generating an error signal representative of a phase difference between said input signal and said feedback signal;

oscillation means for generating a digital pulse train with a frequency which is varied in response to said error signal;

compensation means for performing a mathematical operation on said digital pulse train so as to alter the frequency of said digital pulse train by a predetermined programmable amount to produce an intermediate clock signal;

error reduction means disposed after said compensation means for reducing a frequency of the intermediate clock signal thereby producing said output clock signal and decreasing error propagation; and divider means for mathematically altering the output clock signal by an amount complimentary to said predetermined programmable amount to produce said feedback signal having a second frequency substantially similar to said input signal.

2. The phase locked loop according to claim 1 further comprising filter means disposed after said comparator means having a narrow frequency bandwidth for limiting noise propagation in said error signal.

3. The phase locked loop according to claim 2 wherein said filter means is an analog low-pass filter.

4. The phase locked loop according to claim 1 wherein said error reduction means comprises a series of divide by 2's for reducing the frequency of the intermediate clock signal.

5. The phase locked loop according to claim 4 wherein said divide by 2's are binary down counters.

6. The phase locked loop according to claim 1 further comprising frequency division means disposed between said error reduction means and said divider means for reducing a frequency of the output clock signal to produce a signal useful for image processing.

7. The phase locked loop according to claim 6 wherein said frequency division means comprises a divide by 2 for halving the frequency of the output clock signal.

8. The phase locked loop according to claim 7 wherein said divide by 2 is a binary down counter.

9. The phase locked loop according to claim 1 further comprising regulating means disposed before said comparator means in communication with said input signal for regulating a duty cycle of said input signal to fifty percent.

10. The phase locked loop according to claim 9 wherein said regulating means is a J–K flip-flop clocked by the input signal to produce a signal of one half the frequency of the input signal.

11. A phase locked loop for generating a digital clock signal which is frequency and phase referenced to a tachometer signal of an image recording system, said phase locked loop comprising comparator means for comparing said tachometer signal to a feedback signal and for generating an error signal representative of a phase difference between said tachometer signal and said feedback signal;

filter means having a narrow frequency bandwidth for reducing noise in said error signal;

voltage controlled oscillation means for generating a digital pulse train with a frequency which is varied in response to said error signal;

compensation means for dividing a frequency of said digital pulse train so as to reduce the frequency of said digital pulse train by a programmable amount producing an intermediate clock signal;

frequency division means for reducing a frequency of the intermediate clock signal to produce said digital clock signal useful for pixel interpolation in the image recording system; and divider means for further dividing the digital clock signal to produce said feedback signal having a frequency substantially similar to said tachometer signal.

12. The phase locked loop according to claim 11 wherein said filter means is a low-pass filter for removing high frequency noise.

13. The phase locked loop according to claim 11 wherein said frequency division means comprises a series of divide by 2's for reducing the frequency of the intermediate signal.

14. The phase locked loop according to claim 13 wherein said divide by 2's are binary down counters.

15. The phase locked loop according to claim 11 further comprising regulating means disposed before said comparator means in communication with said tachometer signal for regulating a duty cycle of said tachometer signal to fifty percent.

16. A method for generating a controlled output clock signal which is frequency and phase referenced to an input signal, said method comprising comparing said input signal to a feedback signal and generating an error signal representative to a phase difference between said input signal and said feedback signal;

generating a digital pulse train with a frequency which is varied in response to said error signal;

altering a frequency of said digital pulse train by a programmable amount to produce an intermediate clock signal;

reducing a frequency of the intermediate clock signal to produce said controlled output clock signal and thereby decreasing error propagation; and modifying the controlled output clock signal to produce said feedback signal having a frequency substantially similar to said input signal.

* * * * *